United States Patent [19]

McKinnon et al.

[11] Patent Number: 5,379,766

[45] Date of Patent: Jan. 10, 1995

[54] MAGNETIC RESONANCE IMAGING METHOD AND DEVICE FOR MONITORING MOTION OF A PART OF AN OBJECT BASED ON STIMULATED ECHOES

[75] Inventors: Graeme McKinnon; Stefan Fischer, both of Zürich; Peter Boesiger, Ennetbaden, all of Switzerland

[73] Assignee: U.S. Philips Corporation, New York, N.Y.

[21] Appl. No.: 860,620

[22] Filed: Mar. 30, 1992

[30] Foreign Application Priority Data

Apr. 2, 1991 [EP] European Pat. Off. ........ 91200763.0

[51] Int. Cl.$^6$ ............................................. A61B 5/055
[52] U.S. Cl. .................................. 128/653.2; 128/708; 324/309
[58] Field of Search ................... 128/653.2, 695, 653.3, 128/696, 708; 324/306, 309, 312

[56] References Cited

U.S. PATENT DOCUMENTS 4,914,608 4/1990 Lebihan et al. ................... 128/653.2
5,054,489 10/1991 Axel et al. ............................ 128/695

OTHER PUBLICATIONS

J. Frahm et al., "Rapid NMR Imaging Using Stimulated Echoes", Journal of Magnetic Resonance, vol. 65, (1985) pp. 130–135.

L. Axel et al., "MR Imaging of Motion with Spatial Modulation of Magnetization", Radiology 1989, vol. 171, No. 3, pp. 841–845.

E. McVeigh et al., "A Rapid Starburst Pulse Sequence for Cardiac Tagging", Book of Abstracts, SMRM 1989, Amsterdam, p. 23.

E. A. Zerhouni et al., "Human Heart: Tagging with MR Imaging—A Method of Non-invasive Assessment of Myocardial Motion", Radiology, Oct. 1988, pp. 59–63.

"A Dante Tagging Sequence for the Evaluation of Translational Sample Motion" Mosher et al, Magnetic Resonance in Medicine, vol. 15, No. 2, Aug. 1, 1990 pp. 334–339.

Primary Examiner—Ruth S. Smith
Attorney, Agent, or Firm—Jack D. Slobod

[57] ABSTRACT

A magnetic resonance imaging method and device (1) allow for automatic quantitative motion evaluation of a part of an object (4). The pulse and gradient sequence (tsq1, tsq2), which achieves a high contrast tagging grid, is a stimulated echo based tagging sequence, the tagging section (TAG) being applied before the imaging section (img) or being integrated ($G_9$, $G_{10}$) in the imaging section (img).

9 Claims, 2 Drawing Sheets

MAGNETIC RESONANCE IMAGING METHOD AND DEVICE FOR MONITORING MOTION OF A PART OF AN OBJECT BASED ON STIMULATED ECHOES

BACKGROUND OF THE INVENTION

1. Field of the Invention

The present invention relates to a magnetic resonance imaging method for monitoring motion of a part of an object to be imaged by application of pulse and gradient sequences to the object, which sequences comprise a tagging section for producing a tagging pattern and an imaging section for producing magnetic resonance signals in the part of the object, the resonance signals being used for forming at least one image of the object. Such tagging patterns can be used in connection with cardiac imaging as so-called myocardial tagging grids to evaluate heart motion in multi heart phase imaging, but can also be used for other purposes such as radiation therapy port planning of a liver. In the latter case the tagging is quasi static.

The present invention further relates to a magnetic resonance imaging device for monitoring motion of a part of an object, which imaging device comprises means for generating a stationary homogeneous magnetic field, means for radiating radio frequency pulses to the object which is placed in the stationary field, gradient generating means for generating magnetic gradient fields which are superimposed upon the stationary field, and processing means which are arranged for applying pulse and gradient sequences to the object under the control of control means, the sequences comprising a tagging section and an imaging section, and which imaging device further comprises receiving means and sampling means for receiving and sampling of magnetic resonance signals generated by the sequences in at least a part of the object, the processing means being arranged for processing sampled resonance signals into at least one image.

Of interest is commonly owned copending application Ser. No. 07/859,749, filed Mar. 30, 1992 entitled "Magnetic Resonance Imaging Method and Device for Monitoring Motion of a part of an Object Based on Stimulated Echoes" filed concurrently herewith by the present inventors.

2. Description of the Prior Art

A method and device of this kind are known from the article, "MR Imaging of Motion with Spatial Modulation of Magnetization", L. Axel et at., Radiology, Volume 171, No. 3, 1989 pp. 841-845. For direct imaging of motion of the myocardium a multi heart phase imaging sequence is preceded by a pre-imaging so-called tagging sequence in order to obtain a line or grid reference pattern in the image. The tagging sequence is applied upon detection of the R-wave of an electrocardiogram. The multi heart phase imaging sequence produces magnetic resonance signals in a slice of the heart at different time intervals from the R-wave. Successive magnetic resonance images to be displayed visualize heart motion such as contraction and rotation, the tagging grid in the myocardium being displaced with respect to the chest wall tagging grid in successive heart images of the same slice. The tagging section of the imaging sequence comprises a radio frequency pulse to produce transverse magnetization, a magnetic field gradient to "wrap" the phase along the direction of the gradient and a further radio frequency pulse to mix the modulated transverse magnetization with the longitudinal magnetization. The resulting images show periodic stripes due to the modulation. A second set of modulation bands, for example, in a direction orthogonal to the first, can be produced by following the further radio frequency pulse with a further magnetic field gradient in an appropriate direction and then with a still further radio frequency pulse. Different tagging sections have also been described, e.g. for obtaining a radial tagging pattern, in "A Rapid Starburst Pulse Sequence for Cardiac Tagging", E. McVeigh et al., Book of Abstracts, SMRM 1989, Amsterdam, page 23, or in "Human Heart: Tagging with MR Imaging—A method for Noninvasive Assessment of Myocardial Motion", E. A. Zerhouni et al., Radiology, October 1988, pp. 59-63.

In all these methods it is difficult or not at all possible to evaluate the motion quantitatively, especially automatic evaluation using computer means, due to a relatively poor grid contrast. For images obtained at later stages of the heart cycle the contrast is reduced due to longitudinal relaxation effects. Not only does the grid pattern decay with longitudinal relaxation, but the image intensity becomes increasingly dominated by magnetization which has returned to its relaxed state, and which hence again becomes available for imaging. This relaxed magnetization which is devoid of the grid pattern, and which is thus not useful as far as the tagging is concerned, is a significant factor in reducing the grid contrast.

SUMMARY OF THE INVENTION

It is an object of this invention to provide an improved tagging magnetic resonance imaging method which allows for automatic detection of tagging patterns.

A magnetic resonance imaging method according to the present invention is characterized in that the imaging section comprises at least three radio frequency pulses for generating a stimulated echo resonance signal.

The method according to the present invention is based on the insight that in using stimulated echoes no relaxed magnetization devoid of the grid pattern is being formed after application of the grid pattern, as in the cited Axel article, i.e. due to encoding of the z-magnetization the stimulated echo imaging section inherently only produces tagged component images.

An embodiment of a magnetic resonance imaging method according to the present invention is characterized in that the imaging section comprises further pulses, at least a third and the further pulses being combined with slice selective gradients, phase encoding gradients and readout gradients so as to form imaging sub-sequences, the pulse and gradient sequences being distributed over a motion cycle of the part and being repeated a number of times with different time integrals over the phase encoding gradients for generating magnetic resonance signals for successive slices of the part. Preferably a first and a second radio frequency pulse in the imaging section are 90° pulses, and the third and the further pulses are so-called low flip angle pulses. The resulting tagged images according to the present invention having a high tagging pattern contrast allow for automatic detection of tagging patterns and are therefore suitable for motion detection. The longitudinal relaxation and flip angle dependence is the same as described in the European Application No. 91200762.2 filed by the present applicant and having the same priority date as the present application.

A further advantage is that motion of a particular slice of the heart can be followed if one or both of the first two 90° pulses in the imaging section are made slice selective, while the low flip angle pulses are non slice selective or selective over a greater slice thickness. Then the slice selected by the first two 90° pulses in the imaging section is always imaged. The ability to follow the motion of a particular heart slice implies that three-dimensional motion can be followed with the method according to present invention. In-plane motion is obtained from the tagging grid and through-plane motion is calculated from the phase shift and the gradient characteristics.

It is to be noted that a so-called high speed STEAM NMR sequence is described in an article "Rapid NMR Imaging Using Stimulated Echoes", J. Frahm et al., Journal of Magnetic Resonance 65, pp. 130–135 (1985). Therein each α-pulse or low flip angle pulse is used to obtain one profile, or row of k-space imaging data, for a single image, rather than using each α-pulse for a separate motion cycle phase image, such as a heart phase image. Furthermore, the α-pulse spacing over the motion cycle typically is much wider in the present invention.

An embodiment of a magnetic resonance imaging method according to the present invention is characterized in that the tagging section is applied before the imaging section. A high-contrast tagging method for allowing automatic tagging pattern detection is obtained in one set of measurements. The tagging section can be a so-called SPAMM section, as described in the cited Axel article.

An embodiment of a magnetic resonance imaging method according to the present invention is characterized in that the tagging section and the imaging section are integrated. This allows for a compact high contrast tagging sequence.

An advantageous embodiment of a magnetic resonance imaging method according to the present invention is characterized in that the tagging section comprises two orthogonal gradients, and that a set of pulse and gradient sequences is carried out at least twice, the two orthogonal gradients being applied in combinations of different signs, tagged images being derived from combinations of corresponding tagged images in the sets. Each set applies a different tagging phase pattern. The different combinations give tagging grid images, horizontal tagging line images, vertical tagging line images, untagged images, or displaced tagging grid images, depending on the number of repetitions. The advantage is that a number of tagging patterns can be obtained simultaneously a posteriori.

BRIEF DESCRIPTION OF THE DRAWINGS

The features and advantages of the magnetic resonance imaging method according to the present invention will be more clearly apparent from the following detailed description, in conjunction with the accompanying drawings, wherein.

DESCRIPTION OF THE PREFERRED EMBODIMENT

Figure 1:
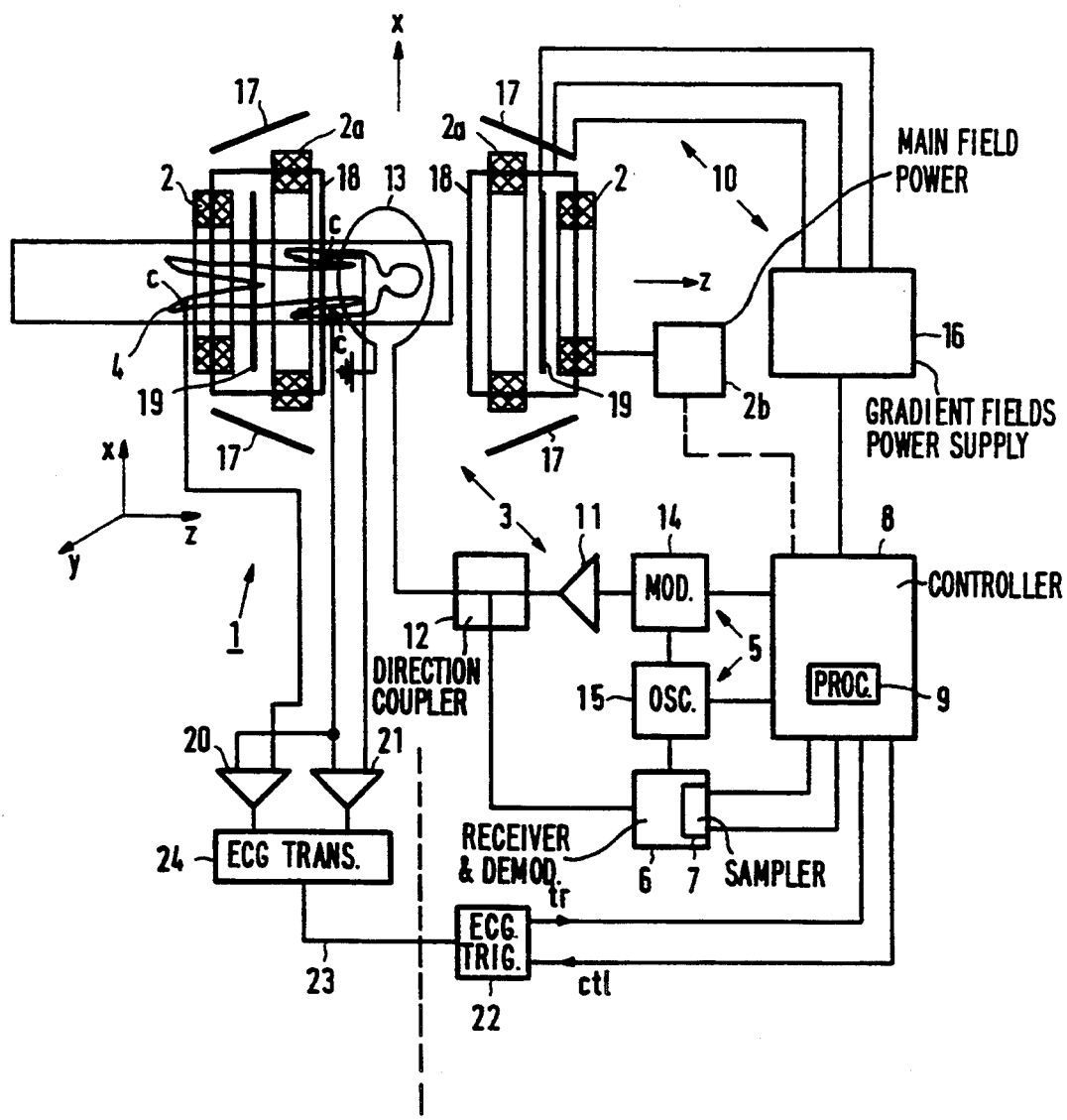
FIG. 1 shows, diagrammatically, a magnetic resonance imaging device according to the present invention.

FIG. 1 shows, diagrammatically a magnetic resonance device 1 according to the invention comprising magnet system formed by coils 2a and associated power supply 2b for generating a stationary homogeneous main magnetic field, means 3 for radiating radio frequency pulses to an object 4, modulating means 5 for modulating the rf-pulses, a receiver and demodulator 6 for receiving and demodulating excited magnetic resonance signals including a sampler 7 for sampling the magnetic resonance signals, and controller 8 for controlling said means 3, 5, 6 and 7. The device 1 further comprises a processor means 9 for processing the sampled magnetic resonance signals, and gradient generating means 10 for generating magnetic field gradients which are superimposed upon the stationary magnetic field. In further detail, the radiating means 3 comprise the modulating means 5, a power amplifier 11, a directional coupler 12 and a transmitter and receiver coil 13. The modulating means 5 comprise a modulator 14 and an oscillator 15. The modulation can be amplitude, frequency or phase modulation or a combination thereof, controlled by the controller 8. The radiating means 3 excite nuclear spins in the object 4 when transmitting rf-pulses, and the receiver and demodulator 6 will receive magnetic resonance signals in response thereto. Transmission and reception may be accomplished with various embodiments, e.g. the coil 13 may be a transmitter/receiver coil or may be embodied as latter transmitter and receiver coils. In the separate embodiment no directional coupler 12 will be present. The receiver and demodulator 6 may comprise a quadrature demodulator, in which case the sampler 7 will comprise two analog-to-digital convertors supplying quadrature detected samples of respective sine and cosine components of the magnetic resonance signal. The gradient generating means 10 comprise a power supply 16 controlled by the controller 8, for separate control of gradient magnetic coils 17, 18 anti 19 which generate magnetic field gradients $G_x$, $G_y$, and $G_z$ respectively. The gradient coils 17, 18 and 19 may be arranged such that the field direction of the magnetic field gradients coincides with the direction of the stationary homogeneous magnetic field, and that the directions of the gradients are perpendicular to each other, indicated in FIG. 1 with mutually perpendicular axes x, y and z. If the magnetic resonance device 1 is put into operation and the object 4 is placed inside the means 2 for generating the stationary field, a small excess of nuclear spins (of nuclei exhibiting a magnetic moment) will be directed in the direction of the stationary magnetic field, which can be considered macroscopically as a magnetization $M_0$, an equilibrium magnetization. The equilibrium magnetization $M_0$ can be disturbed by the application of pulse and gradient sequences to the object 4. For obtaining physiological information from the object 4, the magnetic resonance device 1 comprises several sensors, such as sensors c, for picking up cardiac signals which are fed to preamplifiers 20 and 21. The preamplified cardiac signals are fed to an ECG trigger unit 22 via a fibre optic cable 23 by means of an ECG transmitter 24. The ECG trigger unit 22 supplies trigger pulses tr to the control means 8 for triggering pulse and gradient sequences. The ECG trigger unit 22 is further controlled by the control unit 8 by means of control signal ct1 for inhibiting the ECG trigger unit 22 from sending pulses during predetermined periods. The processing means 9 may comprise programming means so that the pulse and gradient sequence starts from a predetermined time from the trigger pulse tr. The trigger pulse tr may be derived in the trigger unit 22 from the R-wave of the electrocardiogram obtained from the object 4. For a more detailed description of a MRI device and a general description of the principles of MRI, reference is made to the handbook, "Practical NMR Imaging", M. A. Foster and J. M. S. Hutchinson, 1987 IRL Press.

Figure 2:
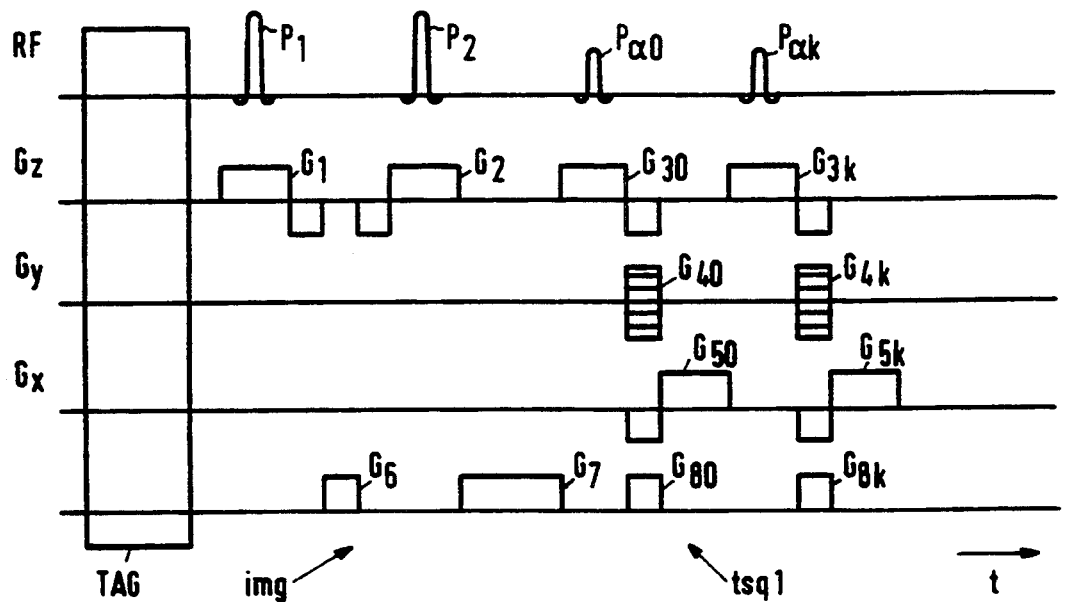
FIG. 2 shows a stimulated echo tagging sequence according to the present invention with a tagging section preceding an imaging section.

In FIG. 2, a stimulated echo tagging sequence tsq 1 according to the present invention with a tagging section (img) TAG preceding an imaging section is shown as a function of time t, to be applied as a multi heart phase imaging sequence, for example. The tagging section TAG, which may be a known tagging section such as the SPAMM section as described in the cited Axel article, is applied upon detection of the R-wave of an electrocardiogram of the object 4. The trigger unit 22 accordingly supplies a trigger pulse tr to the processor 9. The imaging section img is a modified high speed stimulated echo sequence and comprises radio frequency pulses $P_1$ and $P_2$, preferably 90° pulses. The pulses $P_{ak}$, $k=0,\ldots,n-1$, where n is the total number of heart phase images, are low flip angle pulses, not necessarily all equal. The respective pulse angles can be optimized for particular repetition times and longitudinal tissue relaxation times. The gradients $G_1$, $G_2$ and $G_{3k}$ are slice selection gradients. Some of these gradients may be zero or small, depending on the position at which it is desired to image a particular slice. For instance, if the gradients $G_{3k}$ are made zero, then the heart slice to be imaged is that defined spatially by $P_1$ and $G_1$, and the position of the heart at the point of time $P_1$ is applied. The gradients $G_{4k}$ are phase encoding gradients and the gradients $G_{5k}$ are readout gradients for reading out magnetic resonance signals generated by the low-angle imaging sub-sequences. The selection, phase encoding and readout gradients are orthogonal gradients applied to the object 4 by means of the gradient coils 17, 18 and 19. The gradients $G_6$, $G_7$ and $G_{8k}$ are applied for dephasing and are necessary for proper functioning of the stimulated echo sequence. The gradients $G_6$ and $G_{8k}$ should all have the same area and all be applied on the same axis. The gradients $G_6$ and $G_7$ can be applied on different axes. If the gradient $G_6$ is applied on the same axis as the gradient $G_7$, its area should be a third of that of $G_7$ in order that spurious echo signals are suppressed.

Figure 3:
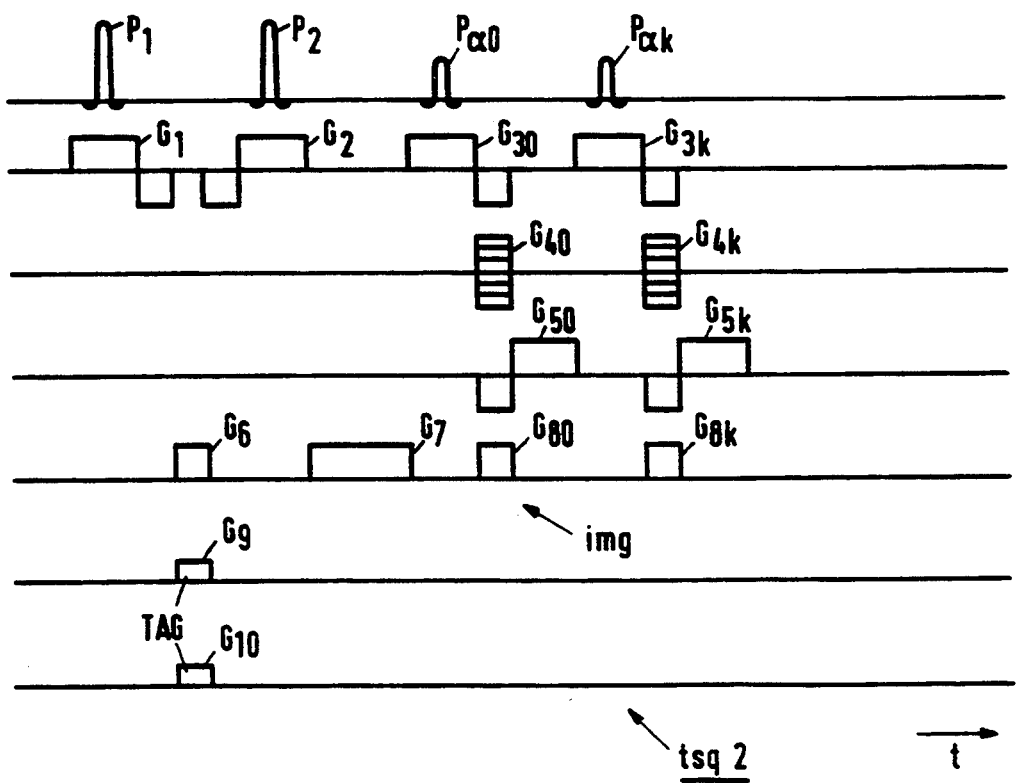
FIG. 3 shows a stimulated echo tagging sequence according to the present invention with an integrated tagging and imaging section.

In FIG. 3, a stimulated echo tagging sequence tsq2 according to the present invention with an integrated tagging and imaging section is shown. Pulses and gradients corresponding to the ones shown in FIG. 2 are equally referenced. The sequence according to the present invention further comprises a tagging gradient $G_9$ and a tagging gradient $G_{10}$ placed alongside the phase encoding gradient and the readout gradient axis, respectively. Four sets of sequences are applied to the object 4 with different sign combinations of the gradients $G_9$ and $G_{10}$, and the resulting tagged images are combined. If $W(x,y)$ is the complex image in the absence of the gradients $G_9$ and $G_{10}$, then the resulting tagged image $A1(x,y)$ obtained from magnetic resonance signals from the object 4 by the processing means 9 with positive tagging gradients $G_9$ and $G_{10}$ is $$A1(x,y) = W(x,y) \cdot \exp(i\alpha x) \cdot \exp(i\beta y)$$

$\alpha$ and $\beta$ being determined by the areas of the gradients $G_9$ and $G_{10}$, respectively. For other sign combinations, respective complex images $A2(x,y)$, $A3(x,y)$ and $A4(x,y)$ are obtained $$A2(x,y) = W(x,y) \cdot \exp(-i\alpha x) \cdot \exp(i\beta y)$$

$$A3(x,y) = W(x,y) \cdot \exp(i\alpha x) \cdot \exp(-i\beta y)$$

$$A4(x,y) = W(x,y) \cdot \exp(-i\alpha x) \cdot \exp(-i\beta y)$$

By combining the An's, $n=1,\ldots,4$, and by taking the modulus of the result as an image, different tagging patterns can be obtained. For instance, $$|A1+A2+A3+A4| = |W(x,y)| \cdot |\cos(\alpha x)| \cdot |\cos(\beta y)|$$

giving a rectangular grid, $$|A1+A2| = |W(x,y)| \cdot |\cos(\alpha x)|$$

giving horizontal sets of tagging lines, and, $$|A3+A4| = |W(x,y)| \cdot |\cos(\beta y)|$$

giving vertical sets of tagging lines. Other combinations, where the An's are weighted by a factor of 1 or −1, give displaced tagging grids or images devoid of grids.

We claim:

1. A magnetic resonance imaging method for monitoring motion of a part of an object to be imaged, which motion is repetitive in successive motion cycles, said method comprising:
   receiving a motion signal indicative of the motion cycle of the portion of the object to be imaged;
   applying pulse and gradient sequences to the object during successive motion cycles, triggered by said motion signal, for producing stimulated echo magnetic resonance signals in the part of the object during a plurality of different phases in the motion cycle; and
   using the stimulated echo magnetic resonance signals produced during at least one of said phases in successive motion cycles, forming at least one image of the object;
   wherein said pulse and gradient sequences comprise a tagging section for producing a tagging pattern and an imaging section comprising successive first, second, third and further radio frequency pulses which are arranged for generating said stimulated echo resonance signals after said third and further radio frequency pulses, said third and further pulses being combined with slice selective gradients, phase encoding gradients and readout gradients so as to form imaging subsequences, which are repeated in the successive motion cycles with different time integrals over the phase encoding gradients.

2. A magnetic resonance imaging method as claimed in claim 1 including applying the tagging section before the imaging section.

3. A magnetic resonance imaging method as claimed in claim 2, including generating in the tagging section at least two radio frequency pulses separated by a gradient for spatially modulating magnetization.

4. A magnetic resonance imaging method as claimed in claim 1 including integrating the tagging section and the imaging section.

5. A magnetic resonance imaging method as claimed in claim 4, including generating at least one gradient between a first and a second radio frequency pulse of the imaging section in the tagging section.

6. A magnetic resonance imaging method as claimed in claim 5, including producing in the tagging section two orthogonal gradients and carrying out at least twice a set of pulse and gradient sequences, applying the two orthogonal gradients in combinations of different signs and deriving further tagged images from combinations of corresponding tagged images in the sets.

7. A magnetic resonance imaging device for monitoring motion of a part of an object, which motion is repetitive in successive motion cycles, said device comprising:

means for receiving a motion signal indicative of the motion cycle of said part of the object;

means for generating a stationary homogeneous magnetic field in a measurement space in which said part of the object is to be located;

means for radiating radio frequency pulses to the object in the measurement space;

gradient generating means for generating magnetic gradient fields superimposed upon the stationary field;

processing means arranged for applying pulse and gradient sequences to the object via said gradient generating means and said radiating means during successive motion cycles, triggered by said motion signal, wherein said pulse and gradient sequences comprise a tagging section for producing a tagging pattern and an imaging section comprising successive first, second, third and further radio frequency pulses which are arranged for generating said stimulated echo resonance signals after said third and further radio frequency pulses, said third and further pulses being combined with slice selective gradients, phase encoding gradients and readout gradients so as to form imaging sub-sequences, which are repeated in the successive motion cycles with different time integrals over the phase encoding gradients;

receiving means and sampling means for receiving and sampling magnetic resonance signals generated by the sequences in at least a part of the object, the processing means being arranged for processing sampled resonance signals received by said receiving and sampling means into at least one image.

8. A magnetic resonance imaging device as claimed in claim 7, wherein the processing means further comprise means for applying the tagging section before the imaging section.

9. A magnetic resonance imaging device as claimed in claim 7, wherein the processing means include means for applying the tagging section and the imaging section in an integrated way.

* * * * *